United States Patent
Jang et al.

Patent Number: 6,157,473
Date of Patent: Dec. 5, 2000

[54] HOLOGRAPHIC STORAGE SYSTEM INCORPORATED THEREIN A PARABOLIC MIRROR

[75] Inventors: Ju-Seog Jang; Dong-Hak Shin; Joo-Youn Park; Jae-Woo Roh, all of Seoul, Rep. of Korea

[73] Assignee: Daewoo Electronics Co., Ltd., Seoul, Rep. of Korea

[21] Appl. No.: 09/224,668

[22] Filed: Dec. 31, 1998

[51] Int. Cl.[7] ..................................................... G03H 1/26
[52] U.S. Cl. ................ 359/22; 359/11; 359/21; 359/209; 359/211; 359/853
[58] Field of Search .................. 359/22, 24, 21, 359/11, 209, 211, 201, 203, 208, 850, 853, 857

[56] References Cited

U.S. PATENT DOCUMENTS

| | | |
|---|---|---|
| 3,664,721 | 5/1972 | Roberts et al. . |
| 4,063,226 | 12/1977 | Kozma et al. . |
| 5,307,210 | 4/1994 | MacFarlane ............................ 359/859 |
| 5,359,403 | 10/1994 | Grosmann et al. ...................... 359/201 |
| 5,519,651 | 5/1996 | Redfield . |
| 5,777,760 | 7/1998 | Hays et al. ................................... 359/7 |
| 5,896,359 | 4/1999 | Stoll ............................................ 359/2 |

FOREIGN PATENT DOCUMENTS

| | | |
|---|---|---|
| 1362240 | 7/1974 | United Kingdom . |
| 1446934 | 8/1976 | United Kingdom . |
| 2002919 | 2/1979 | United Kingdom . |

*Primary Examiner*—Darren Schuberg
*Assistant Examiner*—Fayez Assaf
*Attorney, Agent, or Firm*—Anderson Kill & Olick, PC

[57] ABSTRACT

A holographic storage system implements both a rotational and an angular multiplexings in combination. The system comprises a light source, a pair of wedge prisms, a beam splitter, a first, a second, a third and a parabolic mirrors, a SLM(spatial light modulator) and a storage medium. In the system, a light beam emitted from the light source is split into a reference and a signal beams by the beam splitter. The signal beam reflected by the first mirror to the SLM which modulates data in the firm of pages. The modulated signal beam falls into the storage medium, while the reference beam is reflected by the second mirror to the wedge prisms which deflect the reference beam to an arbitrary position on the third mirror. The deflected reference beam is reflected onto the parabolic mirror by the third mirror. The deflected reference beam is converged onto the storage medium by the parabolic mirror. In the storage medium, the modulated signal beam interferes with the converged reference beam to thereby generate an interference pattern therebetween, wherein the interference pattern contains information of the modulated signal beam. The holographic storage system has a size reduced by incorporating therein the third mirror and the parabolic mirror provided with an opening.

17 Claims, 5 Drawing Sheets

HOLOGRAPHIC STORAGE SYSTEM INCORPORATED THEREIN A PARABOLIC MIRROR

FIELD OF THE INVENTION

The present invention relates to a holographic storage system; and, more particularly, to a holographic storage system with a size reduced by incorporating therein a parabolic mirror.

DESCRIPTION OF THE PRIOR ART

As is well known, demands for optically storing a large amount of data in such cases as a motion picture film have been increasing. Therefore, various types of holographic storage systems incorporating therein a storage medium have been developed for realizing high density optical storage capabilities, wherein the storage medium is conventionally made of lithium niobate($LiNbO_3$) or lithium borate ($Li_2B_2O_4$) and is used for three-dimensionally storing the data in the form of pages.

An angular-multiplexed storage system is most commonly used among these holographic storage systems since a variation in angles can be easily obtained by rotating the storage medium or by deflecting a light beam to be used for writing or reading the data stored in the storage medium. The angular-multiplexed storage system comprises a laser source for generating a coherent light beam, a beam splitter, a first and a second mirrors, a detector and a storage medium in the form of a rectangular hexahedron or rectangular plate. In the system, the coherent light beam from the laser source enters into the beam splitter which splits the coherent light beam into a reference and a signal beams. The reference and the signal beams are reflected to the storage medium by the first and the second mirrors, respectively. Interference patterns generated by the signal and the reference beams are recorded into the storage medium. Therefore, the angular-multiplexed storage system is capable of writing and reading the data into/from the storage medium.

One way for this angular-multiplexed storage system to address the data is achieved by way of controlling the direction of the reference beam onto a specific region within the storage medium. This is typically done through the mechanical movement of mirrors or lenses. However, this method requires that the positions of the mirrors or the lenses for reading be precisely aligned with those for writing.

Another way, known as a rotational multiplexing, is implemented by directly rotating the storage medium about an axis perpendicular to the surface thereof, wherein the axis lies on a plane which includes the reference and the signal beams. Recently, the idea of combining these multiplexing techniques is gaining popularity so as to record a much larger amount of holograms in the storage medium. However, the rotational multiplexing is not adaptable for combination with other multiplexing methods such as spatial multiplexing which is implemented by shifting the storage medium, since different mechanical motions should be implemented to control both the reference beam and the storage medium. And, the implementation of different mechanical motions is often difficult, because, for instance, the rotational stage on which the storage medium is placed should be mounted, in turn, on a translational stage.

Further, one of the common shortcomings of the above-described multiplexing techniques is a large size thereof due to the use of an objective lens which is located in front of the storage medium for converging a reference beam on the storage medium, thereby making the overall size of the holographic storage system bulky.

SUMMARY OF THE INVENTION

It is, therefore, a primary object of the present invention to provide an improved holographic storage system capable of storing large amounts of hologram data into a storage medium by rotating a wedge prism incorporated therein.

In accordance with the present invention, there is provided a holographic storage system for storing/reading multiple holograms, the storage system comprising: a light source; a beam splitter for splitting a light beam emitted from the light source into a reference and a signal beams; a storage medium for storing the multiple holograms thereinto; a first mirror for reflecting the signal beam to the storage medium; a second and a third mirrors; a pair of wedge prisms for deflecting the reference beam, which is reflected to the wedge prisms by the second mirror, to the third mirror and rotating the deflected reference beam by rotating the wedge prisms; and a parabolic mirror for converging the deflected reference beam from the third mirror onto the storage medium.

BRIEF DESCRIPTION OF THE DRAWINGS

The present invention together with the above and other objects and advantages will become apparent from the following description of preferred embodiments, when given in conjunction with the accompanying drawings, wherein.

DETAILED DESCRIPTION OF THE PREFERRED EMBODIMENTS

Figure 1:
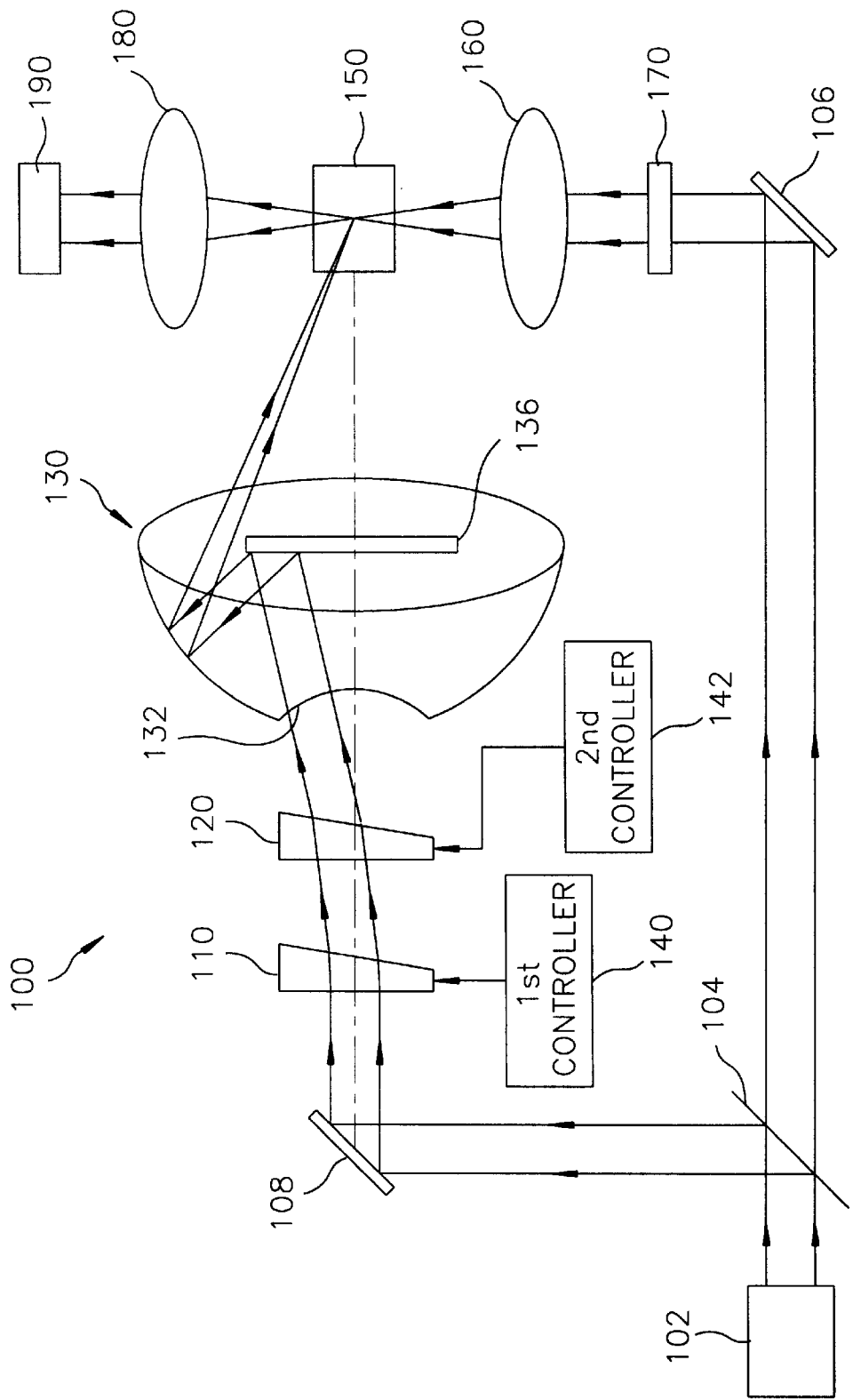
FIG. 1 shows a schematic diagram of a holographic storage system in accordance with the present invention.

Referring to FIGS. 1 and 2, there are illustrated a holographic storage system in accordance with a preferred embodiment of the present invention. It should be noted that like parts appearing in FIGS. 1 and 2 are represented by like reference numerals.

There is illustrated in FIG. 1 a schematic diagram of a holographic storage system 100 in accordance with a preferred embodiment of the present invention. The holographic storage system 100 comprises alight source 102 for generating a coherent light beam, a beam splitter 104, a first, a second and a third mirrors 106, 108, 136, a parabolic mirror 130 provided with an opening 132, a first and a second controllers 140, 142, a storage medium 150, a Fourier transform lens 160, a SLM(spatial light modulator) 170, a detection lens 180, an optical detector 190 and a first and a second wedge prisms 110, 120, wherein each of the wedge prisms 110, 120 having a slope and a normal surface. The optical detector 190 includes an array of M×N elements, each of the elements being capable of detecting a light beam incident thereto.

In the system 100, the coherent light beam emitted from the light source 102, e.g., a semiconductor laser, travels to the beam splitter 104. The beam splitter 104 partially reflects the coherent light beam to thereby split the coherent light beam into a reference beam and a signal beam, wherein the signal beam is a portion of the coherent light beam transmitted to the first mirror 106 through the beam splitter 104 and the reference beam is a remaining portion of the coherent light beam reflected to the second mirror 108 by the beam splitter 104. The storage medium 150 is made of a photorefractive crystal such as lithium niobate(LiNbO$_3$).

And then, the signal beam falls onto the first mirror 106 which reflects the signal beam to the SLM 170. In the first preferred embodiment of the present invention, the SLM 170 includes discrete modulating regions, e.g., an array of M×N modulating pixels, M and N being positive integers, respectively. Each of the M×N modulating pixels is controlled by a voltage applied thereto through an integrated circuit(not shown), whereby the SLM 170 controls an amplitude and a phase of the signal beam impinged onto each of the M×N modulating pixels. Therefore, the SLM 170 is capable of converting the signal beam impinged thereonto into a modulated signal beam which contains data in the form of page after the signal beam passing therethrough. The modulated signal beam is impinged onto the Fourier transform lens 160 which converges the modulated signal beam on a recording area of the storage medium 150. In case that the Fourier transform lens 160 is not used, the modulated signal beam can also be recorded on the recording area of the storage medium 150, directly.

In the meantime, the reference beam enters into the second mirror 108 which reflects the reference beam to the first wedge prism 110. After the reference beam enters the first wedge prism 110, the optical path thereof in the first and the second wedge prisms 110, 120 will be described in detailed hereinafter. In the preferred embodiment, the reference beam is arranged in such a way that it is inclined at an angle $\theta_i$ of incidence with respect to Z-axis. It is preferable that $\theta_i$ is approximately 0 degree. And also, in case when the $\theta_i$ is slightly larger or less than a slanted angle $\theta_{w1}$, the holographic storage system 100 also can record pages of data into the storage medium 150, wherein $\theta_{w1}$ represents an angle between the normal surface 112 and the slope 114 of the first wedge prism 110 as shown in FIG. 2A.

Figure 2A:
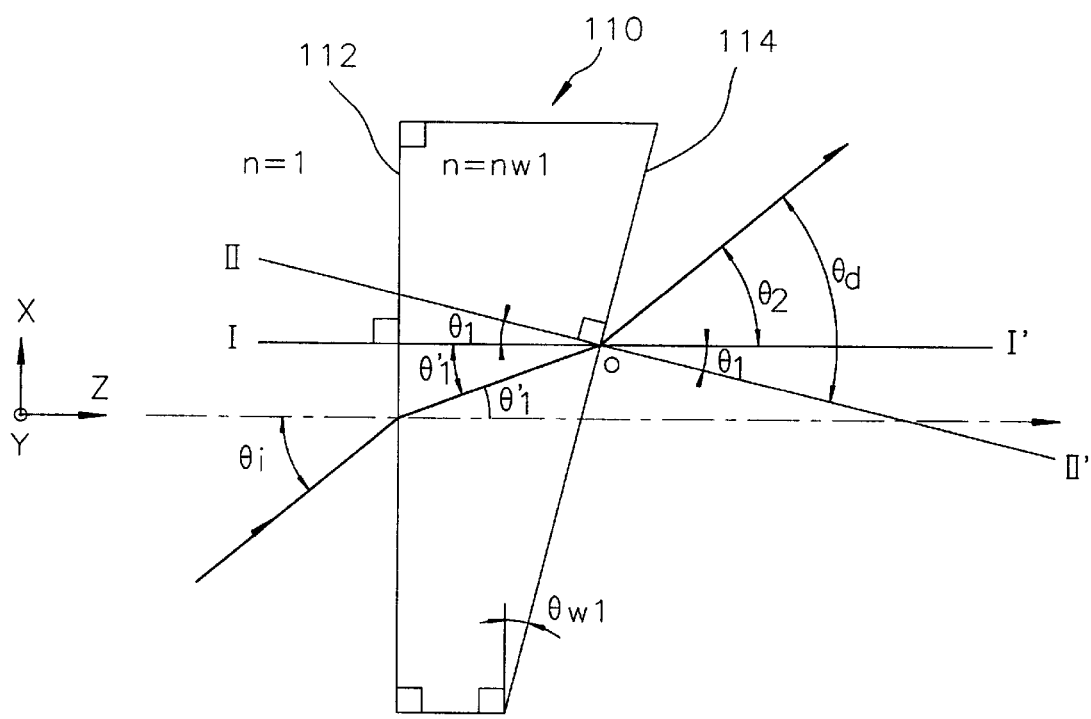
FIGS. 2A to 2D illustrate explanatory diagrams of a light path in a pair of wedge prisms incorporated into the holographic storage system shown in FIG. 1.

Referring to FIG. 2A, there is shown an optical path of the reference beam in the first wedge prism 110 shown in FIG. 1. For the sake of explanation, suppose the normal surface 112 of the first wedge prism 110 is perpendicular to the Z-axis. When the reference beam enters the normal surface 112 with an angle $\theta_i$ of incidence, the reference beam is transmitted into the first wedge prism 110 with a Transmitted angle $\theta_1'$. The angle $\theta_1'$ can be obtained by using the following relationship:

$$n_{w1}\sin\theta_1' = n\sin\theta_i \qquad \text{Eq.(1)}$$

wherein $n_{w1}$ represents a refractive index of the first wedge prism 110, and n, the refractive index of the air. If the $\theta_i$ is much less than $\pi/2$, $\theta_1' \approx \theta_i/n_{w1}$. A point on the slope 114 where the transmitted reference beam arrives at is denoted by O. The two straight lines that pass through the point O are denoted by I–I' and II–II', where I–I' is in parallel with Z-axis and II–II' is normal to the slope 114. If an angle IOII(=II'OI') is represented by $\theta_1$, then $\theta_1 = \theta_{w1}$. The transmitted reference beam impinges onto the slope 114 with an angle$(\theta_1+\theta_1')$ of incidence at a point O and exits the wedge prism 110 with an angle $\theta_d$ at the slope 114 of the wedge prism 110. Therefore, if an angle between the direction of the exited reference beam and Z-axis(or I–I') is given by $\theta_2$, then $\theta_d = \theta_1 + \theta_2$. From Snell's law, we obtain $n_{w1}\sin(\theta_1+\theta_1')=\sin(\theta_1+\theta_2)$ or $n_{w1}\sin(\theta_{w1}+\theta_i/n_{w1}) = \sin(\theta_{w1}+\theta_2)$. For $\theta_{w1}<<\pi/2$, approximately $n_{w1}\theta_{w1}+\theta_i \approx \theta_{w1}+\theta_d$. The angle $\theta_2$ can be written as following relationship:

$$\theta_2 \approx (n_{w1}-1)\theta_{w1}+\theta_i \qquad \text{Eq.(2)}$$

Figure 2B:
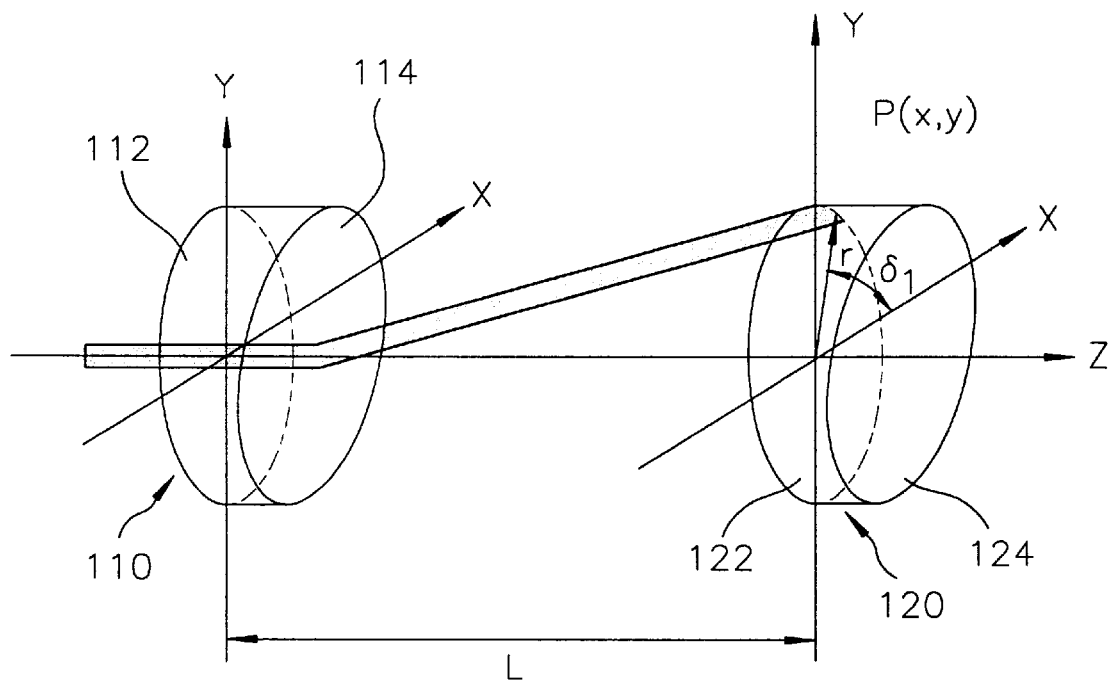

Suppose the first wedge prism 110 rotates about Z-axis. If the second wedge prism 120 is located in the (x, y) plane separated from the normal surface 112 of the first wedge prism 110 at a distance L as shown in FIG. 2B, the trajectory P(x, y) of the exited reference beam will form a circle on the normal surface 122 of the second wedge prism 120. The x and y values of P are given by following relationship:

$$x+jy=r\exp(j\delta_1) \qquad \text{Eq.(3)}$$

wherein j is an imaginary unit, $r=L\tan\theta_2 \approx L\theta_2$, and $\delta_1$ is a rotation angle of the first wedge prism 110 from X-axis.

Figure 2C:
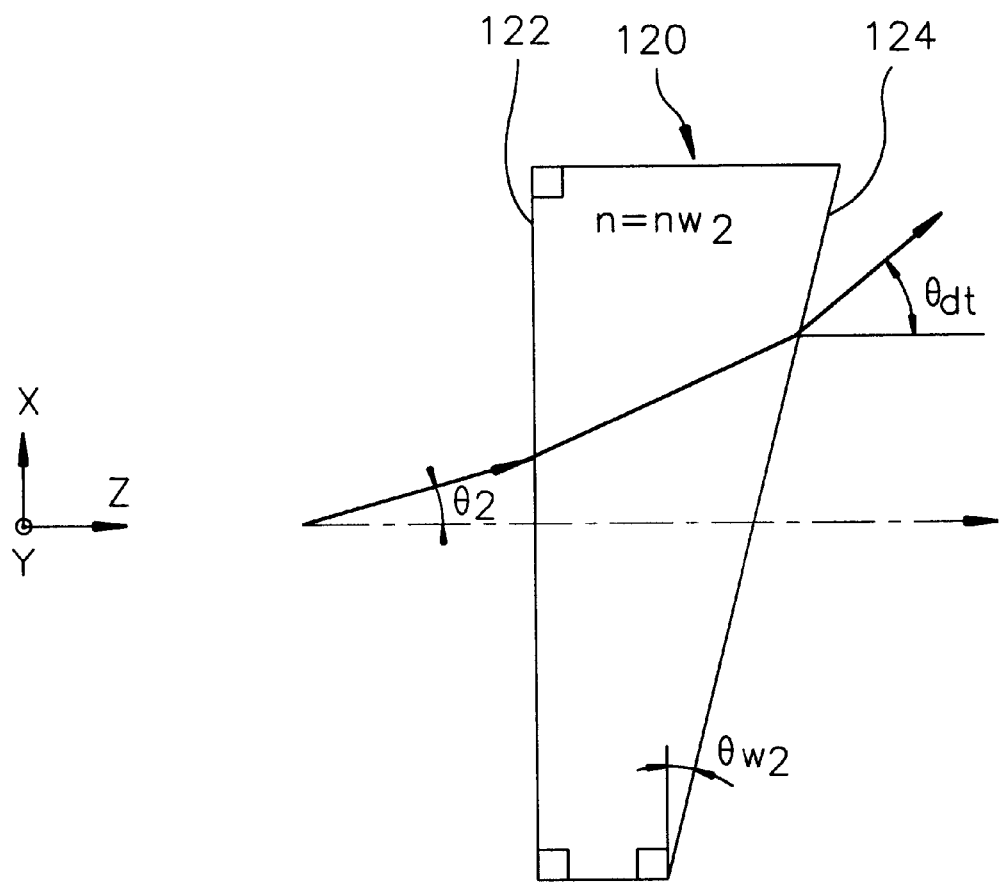

Referring to FIG. 2C, there is shown an optical path of the exited reference beam in the second wedge prism 120 shown in FIG. 1. A total deflection angle $\theta_{dt}$ from Eq. (2), after passing through the first and the second wedge prisms 110, 120, is given by following relationship:

$$\theta_{dt} \approx (n_{w2}-1)\theta_{w2}+(n_{w1}-1)\theta_{w1} \qquad \text{Eq.(4)}$$

because an angle of incidence at the normal surface 122 of the second wedge prism 120 is equal to $\theta_2$ of the first wedge prism 110 and $\theta_i$ is approximately equal to 0. Suppose each of the wedge prisms 110, 120 is rotated about Z-axis by $\delta_1$ and $\delta_2$, respectively. Then, the x and y values of the output beam position P at the third mirror 136 at a distance D from a center point between the two wedge prisms 110, 120 can be written as following relationship:

$$x+jy=r_1\exp(j\delta_1)+r_2\exp(j\delta_2) \qquad \text{Eq.(5)}$$

Figure 2D:
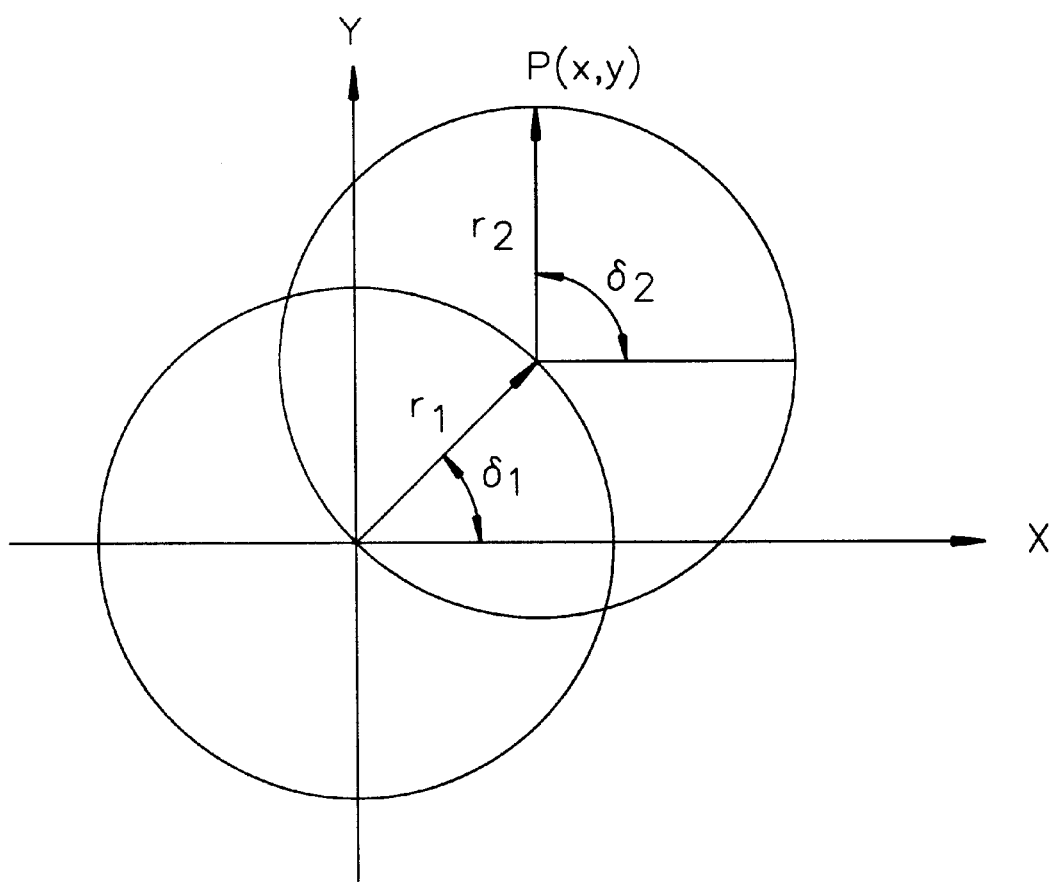

For example, if D is much larger than L and the two wedge prisms 110, 120 are identical to each other in shape, both of $r_1$ and $r_2$ are approximately equal to $D_1\theta_2$. Therefore, the exited reference beam, after passing through the opening 132 of the parabolic mirror 130 and the second wedge prism 120, can be deflected to an arbitrary position within a circle with a radius $2r_1$ on the third mirror 136 by controlling $\delta_1$ and $\delta_2$ properly, thereby obtaining a deflected reference beam. In FIG. 2D, if the two wedge prisms 110, 120 rotate with angular velocities $w_1$ and $w_2$, respectively, the trajectory P(x, y) of the deflected reference beam on the third mirror 136, after passing through the opening 132 of the parabolic mirror 130, is given by $$x(t)+jy(t)=r_1 e^{[j(w_1 t+\delta_1)]}+r_1 e^{[j(w_2 t+\delta_2)]} \qquad \text{Eq.(6)}$$

For example, if $\delta_1 \neq \delta_2$ and $w_1=w_2$, the deflected reference beam rotates circularly with a radius of $2r_1\cos[(\delta_2-\delta_1)/2]$ and the angular velocity $w_1$. In addition, if $\delta_1=\delta_2$ and $w_1=-w_2$, a straight-line motion is obtained in the range of $-2r_1 \leq x \leq 2r_1$, because $x(t)=2r_1\cos(wt)$, $y(t)=0$ in Eq. (6). In general, any kind of motions, such as elliptical, spiral, and concentric circular ones, can be obtained by properly controlling $\delta_1$, $\delta_2$, $w_1$ and $w_2$.

Referring back to FIG. 1, the deflected reference beam is reflected to the parabolic mirror 130 by the third mirror 136. The parabolic mirror 130 converges the deflected reference beam impinging thereto on a recording area of the storage medium 150. In the recording area, the modulated signal beam interferes with the converged reference beam to thereby generate an interference pattern therebetween, wherein the interference pattern contains information of the modulated signal beam.

Although the parabolic mirror 130 in the preferred embodiment is a parabola having an opening 132, the shape of the parabolic mirror 130 is not limited to the parabola. As long as a light beam, after passing through the opening 132, is converged on the storage medium 150, another mirror such as a semi-circle mirror provided with an opening and a grating and the like can also be used for realizing the multiplexing.

If another page of data modulated by the SLM 170 is to be recorded on the recording area of the storage medium 150, the first and the second controllers 140, 142 rotate the wedge prisms 110, 120 with the angular velocities $w_1$ and $w_2$, respectively, so that the holographic storage system 100 realizes both a rotational and an angular multiplexings in combination.

Thereafter, when reading the stored data, the modulated signal beam retrieved from the storage medium 150 enters the optical detector 190 which is capable of detecting the power of the retrieved signal beam. The retrieved signal beam is generated by diffracting the reference beam from the storage medium 150.

While the present invention has been described with respect to the preferred embodiments, other modifications and variations may be made without departing from the spirit and scope of the present invention as set forth in the following claims.

What is claimed is:

1. A holographic storage system for storing/reading multiple holograms, the storage system comprising:
   a light source;
   a beam splitter for splitting a light beam emitted from the light source into a reference and a signal beams;
   a storage medium for storing the multiple holograms therinto;
   a first mirror for directing the signal beam towards the storage medium;
   a second mirror for directing the reference beam towards the storage medium;
   a rotatable wedge prism for deflecting the directed reference beam in a circular pattern; and
   a parabolic mirror, provided with an opening and a third mirror, for converging the deflected reference beam on the storage medium.

2. The storage system of claim 1, wherein the parabolic mirror is disposed between the rotatable wedge prism and the storage medium.

3. The storage system of claim 2, wherein the third mirror is disposed between the parabolic mirror and the storage medium.

4. The storage system of claim 3, wherein the reference beam deflected from the rotatable wedge prism is reflected to the parabolic mirror by the third mirror after passing through the opening of the parabolic mirror.

5. The storage system of claim 4, wherein the third mirror is in the form of a disk.

6. The storage system of claim 1, wherein the rotatable wedge prism includes a first and a second prisms.

7. The storage system of claim 6, wherein each of the prisms is in the form of a wedge.

8. The storage system of claim 7, wherein each of the prisms includes a flat surface and a slope which is inclined at a predetermined angle with respect to the flat surface.

9. The storage system of claim 8, wherein the first prism is disposed between the parabolic mirror and the light source.

10. The storage system of claim 9, wherein the second prism is disposed between the parabolic mirror and the first prism.

11. The storage system of claim 10, wherein an incidence angle of the reference beam onto the normal surface of the first prism ranges from zero to an angle between the normal surface and the slope of the first prism.

12. The storage system of claim 11, further comprising a first controller for rotating the first prism with a first angular velocity $w_1$ and a second controller for rotating the second prism with a second angular velocity $w_2$, whereby the reference beam incident to the first prism is deflected to the arbitrary position on the mirror by rotating the wedge prisms.

13. The storage system of claim 12, further comprising means for modulating the signal beam impinged thereonto into a modulated signal beam which contains data in the form of pages after passing therethrough, the modulating means being placed between the storage medium and the directing means.

14. The storage system of claim 13, wherein, if another page of the hologram is modulated by the modulating means, the controllers change a position of the reference beam on the parabolic mirror by a predetermined amount.

15. The storage system of claim 14, wherein, if $w_1$ is equal to $w_2$, a position of the reference beam impinging onto the parabolic mirror moves along a circle with a constant radius.

16. The storage system of claim 14, wherein, if $w_1$ is equal to $-w_2$, a position of the reference beam impinging onto the parabolic mirror moves along a straight line.

17. The storage system of claim 14, further comprising means for moving the storage medium for a spatial multiplexing.

* * * * *